United States Patent
Raghavan et al.

(10) Patent No.: US 7,586,333 B1
(45) Date of Patent: Sep. 8, 2009

(54) HIGH SPEED, LOW SUPPLY VOLTAGE TOLERANT BOOTSTRAPPED WORD LINE DRIVER WITH HIGH VOLTAGE ISOLATION

(75) Inventors: Vijay Kumar Srinivasa Raghavan, Colorado Springs, CO (US); Ryan Tasuo Hirose, Colorado Springs, CO (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 11/961,517

(22) Filed: Dec. 20, 2007

Related U.S. Application Data

(60) Provisional application No. 60/876,990, filed on Dec. 21, 2006.

(51) Int. Cl.
*H03K 19/094* (2006.01)
*H03K 19/0175* (2006.01)

(52) U.S. Cl. .............................. 326/88; 326/68; 326/80

(58) Field of Classification Search ............. 326/62–63, 326/68, 80–81, 88, 92; 327/333; 365/189.06, 365/189.11, 230.06
See application file for complete search history.

(56) References Cited

U.S. PATENT DOCUMENTS

| 5,999,461 A | * | 12/1999 | Verhaeghe et al. | ..... 365/189.11 |
| 6,324,100 B1 | * | 11/2001 | Atsumi et al. | ......... 365/185.27 |
| 2007/0008805 A1 | * | 1/2007 | Jung et al. | ............. 365/230.06 |

* cited by examiner

*Primary Examiner*—Anh Q Tran

(57) ABSTRACT

Disclosed are a circuit and a method for a high speed, low supply voltage tolerant bootstrapped word line driver with high voltage isolation. The circuit includes a low voltage driver. A gate bootstrapped transistor is coupled to the low voltage driver. A first transistor is coupled to an output terminal of the gate bootstrapped transistor. A substrate of the first transistor is coupled to a negative bias signal. A second transistor is coupled to a gate terminal of the gate bootstrapped transistor. A substrate of the first transistor is coupled to a negative bias signal.

20 Claims, 8 Drawing Sheets

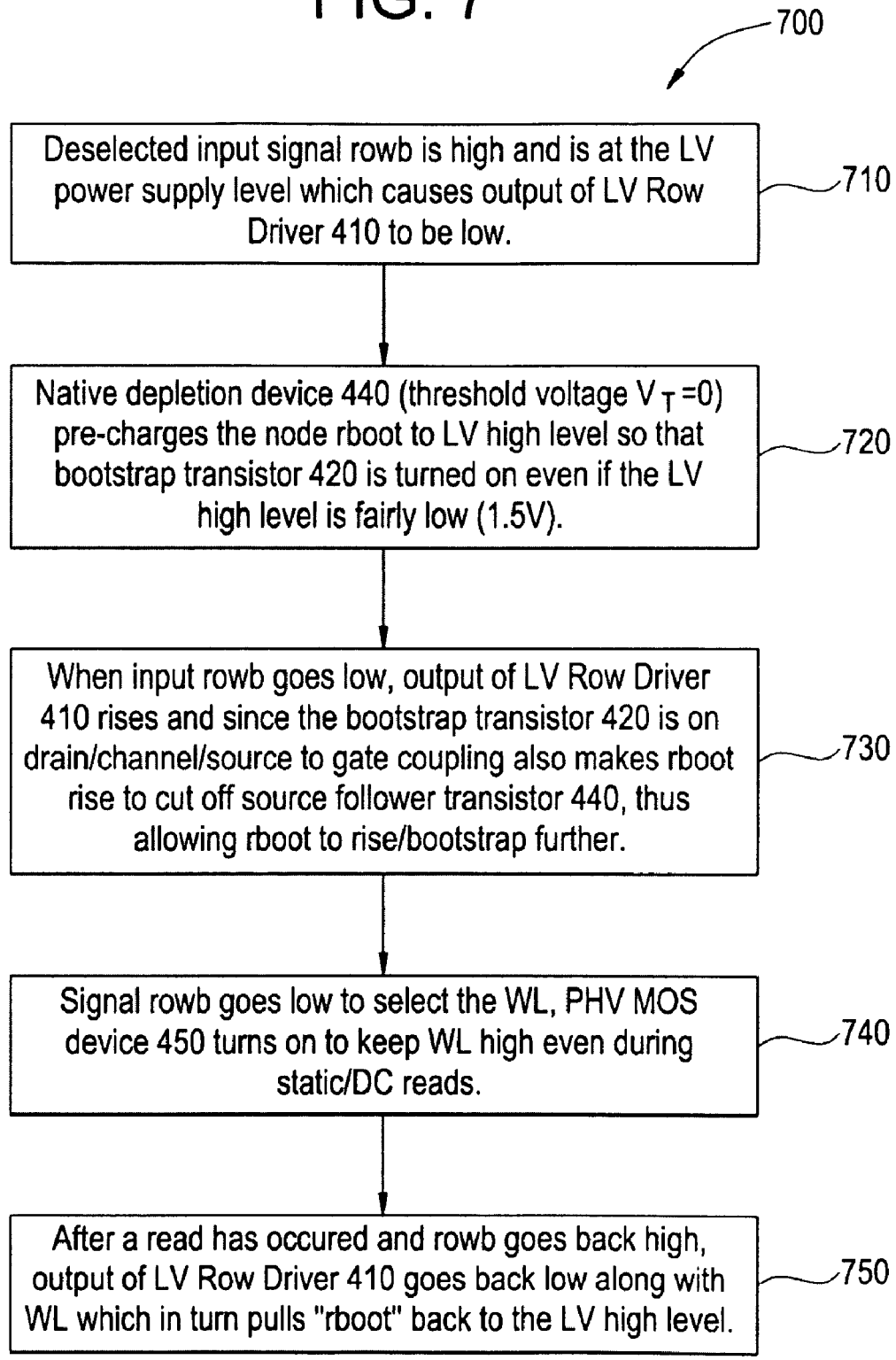

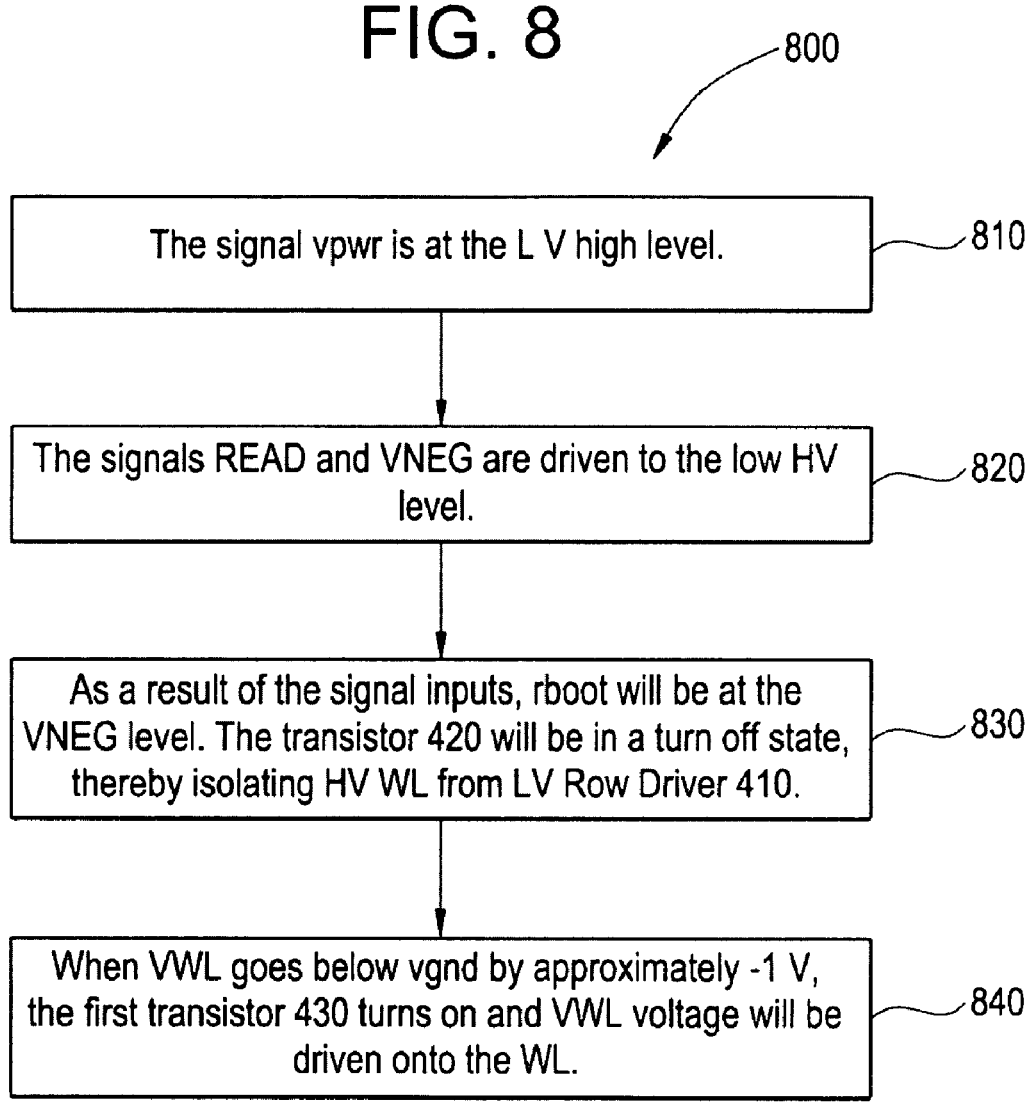

HIGH SPEED, LOW SUPPLY VOLTAGE TOLERANT BOOTSTRAPPED WORD LINE DRIVER WITH HIGH VOLTAGE ISOLATION

This application claims priority under 35 U.S.C. §119(e) to U.S. Provisional Application No. 60/876,990, filed on Dec. 21, 2006, the entire contents of which are hereby incorporated by reference herein.

BACKGROUND

1. Field of the Invention

The present invention relates to word line driver circuits. More particularly, the present invention relates to a circuit and a method for high speed, low supply voltage tolerant bootstrapped word line driver with high voltage isolation.

2. Background Information

Conventional volatile and non-volatile memory, devices include an array of memory cells. Memory cells are storage units arranged at the intersections of a plurality of word lines arranged in a row direction and a plurality of bit lines arranged in a column direction. Memory cells are programmed in the following manner. In a first step, a row address and a column address are supplied to memory cells of a memory chip to select a wordline and to select a bitline respectively. In a second step, from the plurality of word lines, only one word line is selected and the memory cell coupled to the selected word line is driven by a word line driver. In a third step, the bit lines coupled to the selected word line carry the contents of the selected memory cells. In a fourth step, the data in the bitlines are amplified by the sense amplifiers to output the logic data during a read cycle. In a fifth step, during a write cycle, data is forced from the high voltage page latch write drivers to the bit lines into the enabled memory cells. The word line driver circuit is one of the most important circuits in a memory array.

In a conventional memory read operation, all memory circuit voltage levels are low voltage (LV) levels even for the high voltage (HV) memory circuits. However, during HV circuit program/erase operations, LV circuits are biased with low voltage only and HV circuits are biased with high voltage. HV is defined as voltages higher than the normal LV power supply range. In general, LV devices can only support LV levels, but HV devices can support both LV and HV levels. LV devices have lower threshold voltages compared to the HV devices. Also, LV devices have thinner gate oxides than the HV devices. Hence, a LV device has higher drive strength than a HV device for a given device size.

A conventional Bi-gate non-volatile (NV) memory cell comprises a CMOS (Complementary Metal Oxide Semiconductor) select gate and comprises a SONOS (Silicon Oxide Nitride Oxide Silicon) gate, which requires the CMOS select gate to be a high speed gate terminal. As a result, the CMOS select gate is driven with LV higher gain devices like a conventional LV Row Driver.

Referring to FIG. 1, a conventional SONOS memory cell coupled with the wordline driver system 100 is shown, which comprises a LV driver 110. The LV driver 110 is configured as an inverter, which is coupled to a signal word line bar wlb at an input terminal and generates an output signal word line WL. A first NMOS (N-channel Metal Oxide Semiconductor) transistor 120 of the memory cell is coupled to the output signal WL at a gate terminal and a SONOS transistor 122 is coupled to an output signal Word Line SONOS select (WLS) from a HV row switch 130. The NMOS transistor 120 is a select transistor of the memory cell. The first NMOS transistor 120 and the SONOS transistor 122 are coupled in a series configuration of a SONOS memory cell. The SONOS transistor 122 is driven by the HV row switch 130. To improve the program inhibit characteristics of the SONOS memory cell shown in FIG. 1, it is often required to operate the Word Line WL at HV levels during program operations. A disadvantage of the conventional word line driver system 100 is that HV isolation is absent between the LV row driver 110 and Word Line WL. Due to this, WL cannot operate at HV levels, and, hence, better program inhibit characteristics cannot be realized.

Referring to FIG. 2, another conventional SONOS memory cell word line driver 200 is shown, which comprises a HV Level Shifter 210. An input signal row bar (rowb) is coupled to the HV level shifter 210. An output terminal of the HV Level Shifter 210 is coupled to input terminal of a HV row driver 220, wherein the HV row driver is configured as an inverter. The HV level shifter 210 and the HV row driver 220 represent a word line driver circuit. A memory cell select transistor 230 (a first NMOS transistor) is coupled to an output signal word line WL from the HV row driver 220. A SONOS transistor 232, which is coupled in series with the memory cell select transistor 230 is further coupled to a Word Line SONOS select signal (WLS) at its gate terminal. The series combination of the SONOS transistor 232 and the select transistor 230 represents a SONOS memory cell. The Word Line (WL) needs to be driven with LV or HV, and the row driver must now be a HV row driver 220 as shown in FIG. 2, which can also support LV levels. The devices within the HV Row Driver 220 and also the HV Level Shifter 210 are made of p-channel high voltage (PHV) and n-channel high voltage (NHV) devices that can support High Voltage (HV) for a given technology.

During memory read operations, LV input signal row bar (rowb) is high to deselect the Word Line in a low slate. When the signal rowb goes low, the HV Level Shifter 210 and the HV Row Driver 220 operate to bring the Word Line to a high LV state. In the HV memory program operation, to improve the program inhibit characteristics of the memory cell, a high LV row bar rowb input signal is level shifted to HV levels and the HV Row Driver 220 then drives a HV low onto the Word Line. Similarly, a low LV row bar rowb input signal is level shifted and then a HV high signal is driven onto the Word Line. It is to be noted that a high HV signal during memory program operation is the positive power supply of both the HV Level Shifter 210 and Row Driver 220 and is normally higher than the LV power supply. A low HV signal during memory program operation is the low power supply of the HV Level Shifter 210 and Row Driver 220. Moreover, the low HV signal can be lower than ground potential which is the LV power supply low level.

A disadvantage of the word line driver 200 shown in FIG. 2 is that it has slow read speeds due to power Supply headroom issues related to high threshold voltage ($V_T$) of the HV devices. Another disadvantage is slow speed of the HV Level Shifter and the HV Row Driver, and added parasitic loading due to large HV devices. In one application using 130 nm EEPROM and Flash SONOS technology, HV devices with gate oxide thickness ($T_{ox}$) of 110 Angstorm and drawn channel length (L) of 0.5 um must withstand 11 Volts on the source/drain relative to the bulk and 7.4 Volts on the gate relative to the channel. Normal LV devices in the EEPROM technology have $T_{ox}$ or 32 Angstorm with minimum channel length (L) of 0.15 um. In a conventional solution, since both the $T_{ox}$ and L are inversely proportional to gain and thus speed, the size of HV devices to maintain the speed of LV circuits needs to be approximately 11.5 times larger in width than LV device sizes [~(110 Angstorm/32 Angstorm)×(0.5 um/0.15 um)] that would normally drive the Word Line. This dimension is impractical especially when considering that the Word Line Drive devices need to be placed on the row pitch of the memory cell. Since the HV Level Shifter and HV Row Driver consist of PHV (P-channel High Voltage) and NHV (N-channel High Voltage) devices with threshold voltages ($V_T$) that can be greater than 60% of the LV power supply range, this conventional circuit is slow due to voltage headroom issues where the gate drive of the PHV and NHV devices is low. Thus, the conventional device speed and functionality are impacted.

Referring to FIG. 3, another conventional SONOS word line driver system 300 is shown, which comprises a LV row driver 310 coupled to transmission gate logic. An input signal row bar (rowb) is coupled to the LV row driver 310, wherein the row driver is configured as an inverter. An output terminal of the LV row driver 310 is coupled to an input terminal of a transmission gate 320. The transmission gate 320 is coupled to a high voltage signal (HV Pass/Iso) at a first control terminal. The second control terminal of the transmission gate 320 is supplied by the inverted version of the high voltage signal HV Pass (may also be referred to as signal Iso). An output terminal of the transmission gate 320 is coupled to a SONOS memory cell 330 and is coupled to a HV Switch 340. The SONOS memory cell 330 comprises a select transistor 332 (a first NMOS transistor), which is coupled to an output signal word line WL. A SONOS transistor 334, which is coupled in series with the select transistor 332, is further coupled to a Word Line SONOS Select signal (WLS) at its gate terminal. In a memory read step, the word line driver system 300 shown in FIG. 3 passes LV signals from LV Row Driver to the Word Line. In a memory programming step, the word line driver system 300 isolates HV levels on WL from the LV Row Driver 310. The Word Line obtains the HV level from the HV Switch 340 that is off during memory read operations. During memory read, the LV input signal row bar (rowb) of deselected rows is high and the output of the LV Row Driver 310 is low, which is passed by the transmission gate 320 to the deselected Word Line. When the signal row bar (rowb) goes to a low LV level, the selected Word Line goes to a high LV level. The transmission gate 320 is in a switched off mode during memory programming. Thus, the LV Row Driver 310 does not see any high voltage. In accordance with an exemplary embodiment of the present invention the word line driver system 300 can be a memory system.

A disadvantage of the conventional SONOS memory cell Word Line Driver 300 shown in FIG. 3 is that of slow read speeds since the transmission gate 320 also suffers from voltage headroom issues due to high threshold voltage ($V_T$) PHV and NHV devices. Since the transmission gate 320 needs to isolate HV in program operations, the devices need to be PHV and NHV devices. Moreover, to maintain speed, the conventional device sizes need to be on the order of approximately 11.5 times (as described earlier) the LV Row Driver size, which is very difficult to fit on the memory cell row pitch. Also, the gates of the PHV and NHV devices of the transmission gate and the HV switch need to have HV gate control signals.

It is desirable to provide a high speed row driver circuit with bootstrapped interface to Word Line (WL) that does not suffer from leakage, speed or power supply headroom limitations.

SUMMARY OF THE INVENTION

A circuit and method are disclosed for high speed, low supply voltage tolerant bootstrapped word line driver with high voltage isolation. In accordance with exemplary embodiments of the present invention, according to a first aspect of the present invention, a circuit includes a low voltage driver. The circuit includes a gate bootstrapped transistor coupled to the low voltage driver. The circuit includes a first transistor coupled to an output terminal of the gate bootstrapped transistor, wherein a substrate of the first transistor is coupled to a negative bias signal. The circuit includes a second transistor coupled to a gate terminal of the gate bootstrapped transistor, wherein a substrate of the second transistor is coupled to the negative bias signal.

According to the first aspect, the low voltage driver comprises an inverter circuit. The gate bootstrapped transistor comprises a bootstrapped N-channel High Voltage (NHV) Metal Oxide Semiconductor (MOS) device. The bootstrapped NHV MOS transistor comprises a gate terminal bootstrapped above a Low Voltage (LV) power supply level. The first transistor comprises an N-channel High Voltage (NHV) Metal Oxide Semiconductor (MOS) device coupled between the output terminal of the gate bootstrapped transistor and a word line high voltage signal. The second transistor comprises an N-channel High Voltage (NHV) Metal Oxide Semiconductor (MOS) native depletion device coupled between a gate terminal of the gate bootstrapped transistor and a read signal. The circuit further includes a P-channel High Voltage (PHV) Metal Oxide Semiconductor device coupled to a common node of the first transistor and the gate bootstrapped transistor. A size of the gate bootstrapped transistor is larger than a size of both the first transistor and the second transistor.

According to a second aspect of the present invention, a word line driving device includes a low voltage row driver circuit. The device includes a gate bootstrapped transistor coupled to the low voltage row driver circuit. The device includes a write mode transistor coupled to the gate bootstrapped transistor. The device includes a source follower transistor coupled to a gate terminal of the gate bootstrapped transistor, wherein the source follower transistor is configured as a pre-charging circuit.

According to the second aspect, the low voltage row driver circuit comprises an inverter circuit. The gate bootstrapped transistor comprises a bootstrapped N-channel High Voltage (NHV) Metal Oxide Semiconductor (MOS) device. The bootstrapped NHV MOS transistor comprises a gate terminal bootstrapped above Low Voltage (LV) power supply levels. The write mode transistor comprises an N-channel High Voltage (NHV) Metal Oxide Semiconductor (MOS) device coupled between an output terminal of the gate bootstrapped transistor and a word line high voltage signal. The source follower transistor comprises an N-channel High Voltage (NHV) Metal Oxide Semiconductor (MOS) native depletion device coupled between a gate terminal of the gate bootstrapped transistor and a read signal.

According to a third aspect of the present invention, a method for providing bootstrapped high voltage isolation using low supply voltage tolerant word line (WL) driver is disclosed. The method comprises steps of: pre-charging a boot node to a low voltage supply value during a memory read mode; enabling a bootstrap of the boot node responsive to a signal transition at drain and source nodes of a bootstrap transistor; and isolating a low voltage row driver from a word line during a non-volatile memory program mode.

According to the third aspect, the step of pre-charging comprises: maintaining a low voltage power supply level of read and program signals; and generating a low voltage level signal through a low voltage row driver input. The step of enabling comprises: generating a low to high transition at an output of a low voltage row driver; maintaining high gate drive of the bootstrap transistor, and minimizing a delay between generation of the output of the low voltage row driver and enabling a word line. The step of isolating comprises delivering negative high voltage signal to the word line. The step of delivering comprises turning off the bootstrap transistor. According to an exemplary embodiment of the third aspect, the method for providing bootstrapped high voltage isolation comprises a step of connecting a high voltage (HV) keeper device in a bootstrap circuit under direct current (DC) or slow speed conditions; and a step of connecting grounded gate HV devices to steer negative voltages to a word line during memory program operations.

BRIEF DESCRIPTION OF THE DRAWINGS

Other objects and advantages of the present invention will become apparent to those skilled in the art upon reading the following detailed description of preferred embodiments, in conjunction with the accompanying drawings, wherein like reference numerals have been used to designate like elements, and wherein:

FIG. 7 illustrates a method describing a read operation of a memory which comprises a high speed row driver circuit, in accordance with an exemplary embodiment of the present invention.

FIG. 8 illustrates a method describing a non volatile program operation of a memory which comprises a high speed row driver circuit, in accordance with an exemplary embodiment of the present invention.

DETAILED DESCRIPTION OF THE PREFERRED EMBODIMENTS

Exemplary embodiments of the present invention are directed to a circuit and method for a high speed row driver with bootstrapped interface to Word Line (WL) that does not suffer from leakage, speed or power supply headroom limitations. In an exemplary embodiment of the present invention, a high speed row driver circuit includes a low voltage driver. A gate bootstrapped transistor is coupled to the low voltage driver. A first transistor is coupled to an output terminal of the gate bootstrapped transistor, a substrate of the first transistor is coupled to a negative bias signal; and a second transistor coupled to a gate terminal of the gate bootstrapped transistor, a substrate of the second transistor is coupled to the negative bias signal. According to exemplary embodiments, a high speed bootstrapped row driver is provided that does not suffer from power supply headroom limitations and also provides HV (High Voltage) isolation with means to bring WL (Word Line) to negative HV during program operation. An HV keeper device is connected in a bootstrap circuit under direct current (DC) or slow speed conditions. Grounded gate HV devices are connected in the driver circuit to steer negative voltages to the WL.

In an exemplary embodiment of the present invention, the low voltage driver can comprise an inverter circuit or the like. The gate bootstrapped transistor can comprise, for example, a bootstrapped N-channel High Voltage (NHV) Metal Oxide Semiconductor (MOS) device or the like. The bootstrapped NHV MOS transistor can comprise, for example, a gate terminal bootstrapped above a Low Voltage (LV) power supply level. The first transistor can comprise an NHV MOS device or the like coupled between the output terminal of the gate bootstrapped transistor and a word line high voltage signal. The second transistor can comprise an NHV MOS native depletion device or the like coupled between a gate terminal of the gate bootstrapped transistor and a read signal. According to an exemplary embodiment of the present invention, the high speed row driver circuit can further include a P-channel High Voltage (PHV) MOS device or the like coupled to a common node of the first transistor and the gate bootstrapped transistor. The size of the gate bootstrapped transistor can be larger than a size of both the first transistor and the second transistor.

Figure 1:
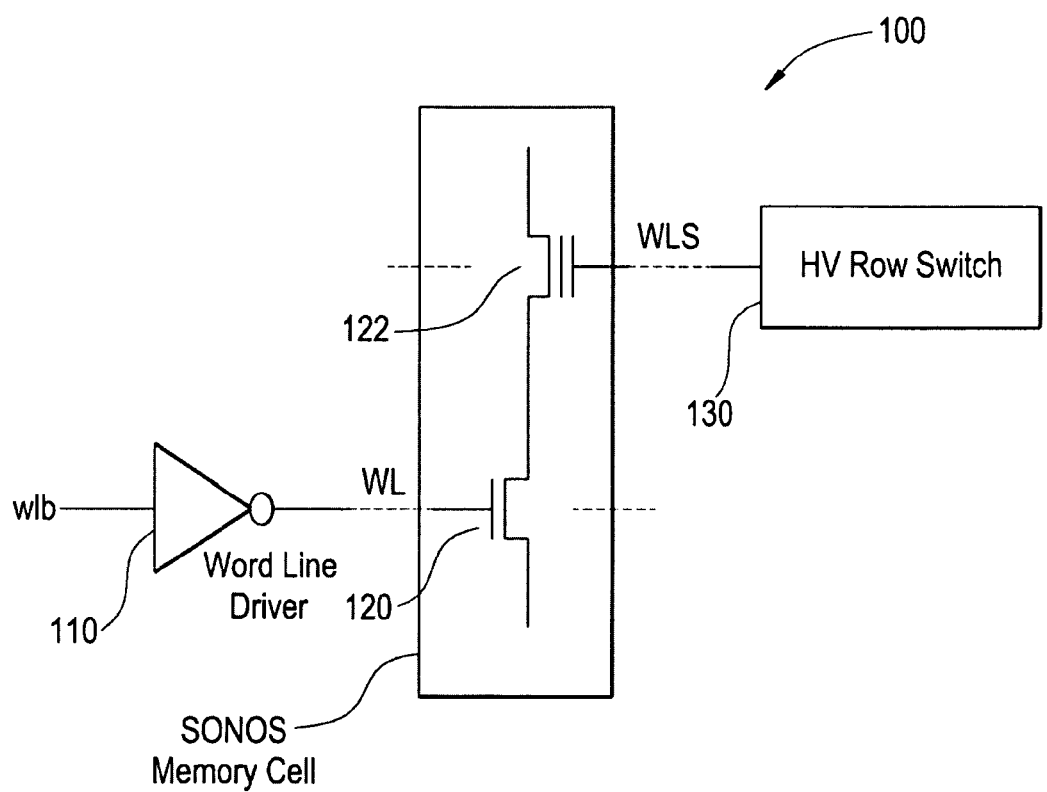
FIG. 1 illustrates a conventional SONOS (Silicon Oxide Nitride Oxide Silicon) memory cell coupled to a word line driver system comprising a low voltage (LV) row driver.
Figure 2:
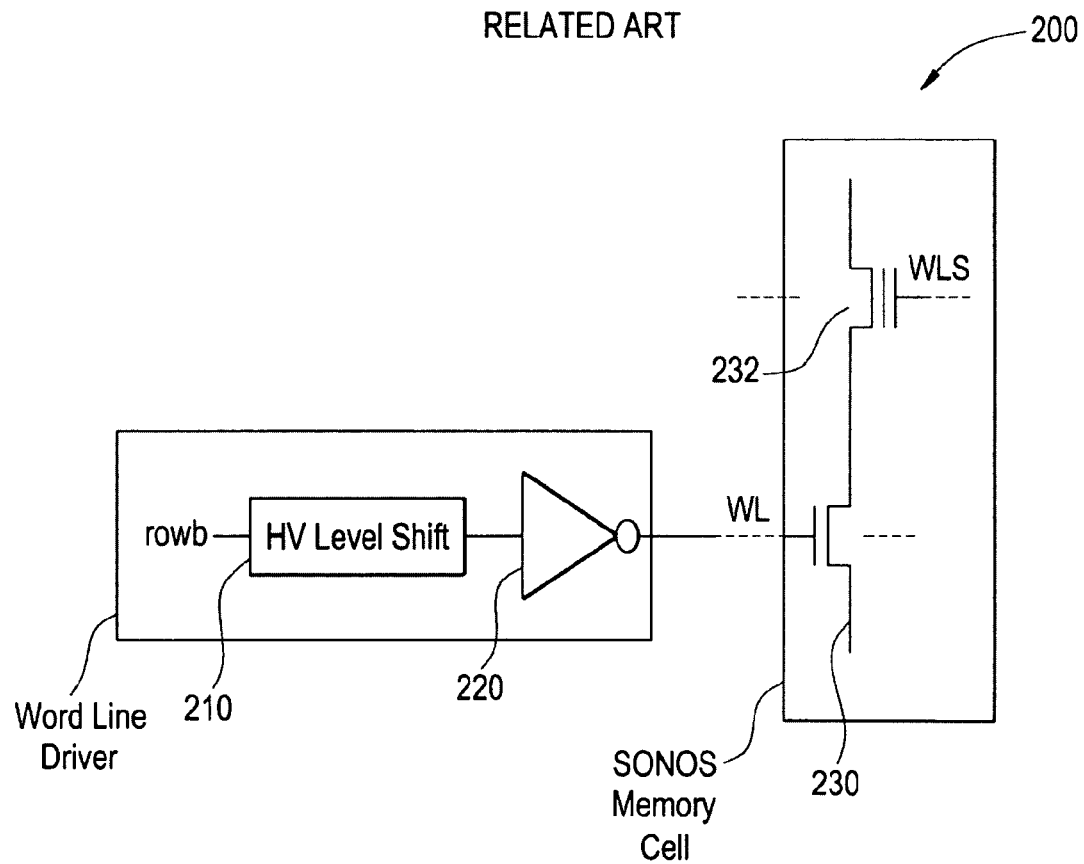
FIG. 2 illustrates a conventional SONOS memory cell coupled to a word line driver system comprising a high voltage (HV) row driver and a high voltage (HV) level shifter.
Figure 3:
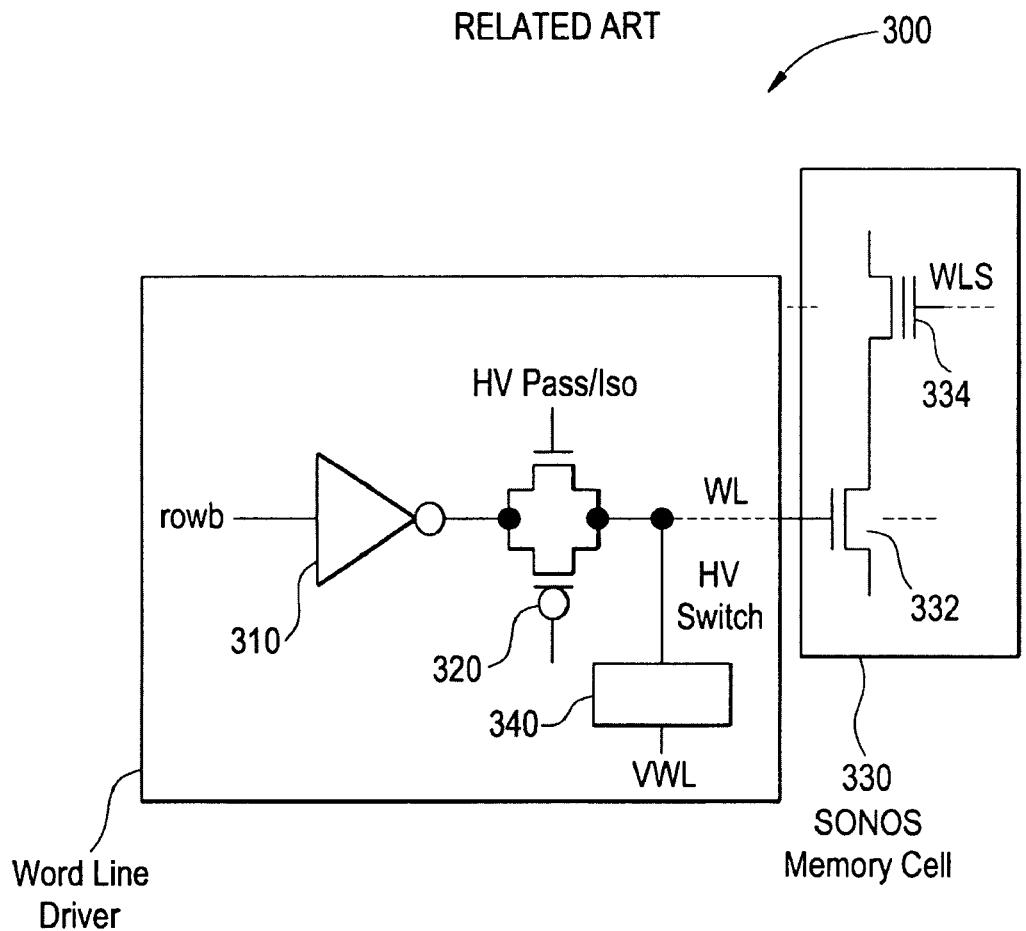
FIG. 3 illustrates a conventional SONOS memory cell coupled to a wordline driver system comprising a low voltage (LV) row driver coupled to transmission gate logic.
Figure 4:
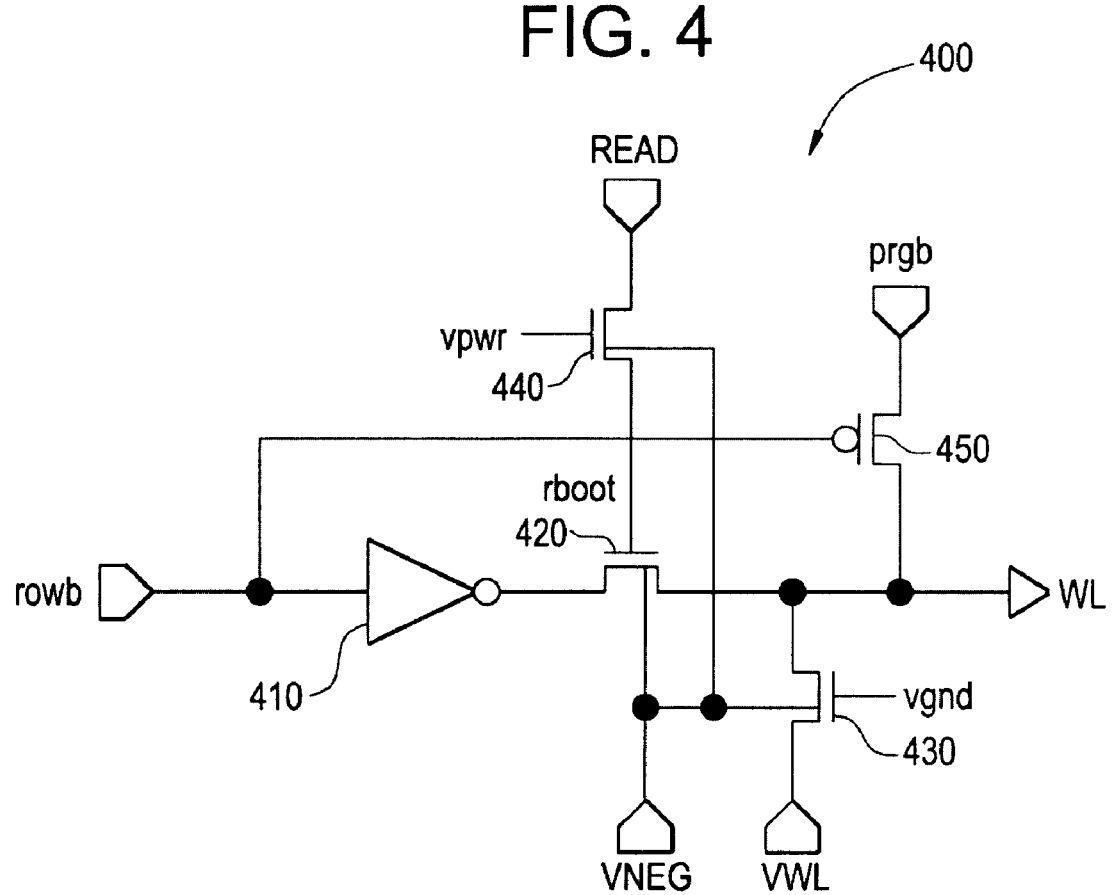
FIG. 4 illustrates a high speed word line driver circuit, in accordance with an exemplary embodiment of the present invention.

These and other aspects and embodiments of the present invention will now be described in greater detail. FIG. 4 illustrates a high speed word line driver circuit 400 comprising a low voltage driver 410 receiving a signal row bar (rowb) at its input terminal. A gate bootstrapped transistor 420 is coupled to the low voltage driver 410. A first transistor 430 is coupled to an output terminal of the gate bootstrapped transistor 420. A substrate of the first transistor 430 is coupled to a negative bias signal VNEG. A second transistor 440 whose threshold voltage is approximately 0 v (i.e., a native NMOS depletion device) is coupled to a gate terminal of the gate bootstrapped transistor 420 (node rboot). The bias signal VNEG goes negative during memory program operations and is at LV ground (zero potential) during read operations. The low voltage driver 410 comprises an inverter circuit or other like circuit or device. According to an exemplary embodiment, the gate bootstrapped transistor 420 can comprise a bootstrapped N-channel High Voltage (NHV) Metal Oxide Semiconductor (MOS) device or the like, although the gate bootstrapped transistor 420 can comprise any suitable type of bootstrapped transistor device. For example, the bootstrapped NHV MOS transistor can further comprise a gate terminal bootstrapped above (in the range of 70% to 90% above power supply level i.e., the gate of the bootstrapped device can be in the range of 1.7*vpwr to 1.9*vpwr as an exemplary and a non limiting range) LV power supply levels.

According to an exemplary embodiment, the first transistor 430 can comprise an NHV MOS device or the like coupled between an output terminal of the gate bootstrapped transistor 420 and a word line supply voltage (VWL), although the first transistor 430 can comprise any suitable type of transistor device. A gate terminal of the first transistor 430 is coupled to a grounded terminal (vgnd). The first transistor 430 steers a high VWL signal during memory program operation to the Word Line (WL) as required for better program inhibit characteristics and reliable memory operation. During read operations, VWL is kept at LV ground potential. According to an exemplary embodiment, the second transistor 440 can comprise an NHV MOS native depletion device (i.e., its threshold voltage is zero) or the like coupled between a gate terminal of the gate bootstrapped transistor 420 and a read signal (READ), although the second transistor 440 can comprise any suitable type of transistor device. A gate terminal of the second transistor 440 is coupled to a power supply signal (vpwr). The second transistor 440 serves several purposes. First, during reads it acts as a source follower and pre-charges the node rboot to the LV power supply level that signal READ is statically biased. The second transistor 440 cuts off when the node rboot starts to rise/bootstrap above the LV power supply level (around 70% to 90% of LV power supply level (vpwvr), i.e., the gate of the bootstrapped device can rise to around 1.7*vpwr to 1.9*vpwr in an exemplary and non limiting embodiment) as a result of the rising output of the LV Row Driver. The transistor 440 thus maintains a high gate drive on the gate bootstrapped transistor 420 with no loss of speed. Additionally, during memory program operation the second transistor 440 connects the signal READ at a negative (VNEG) level (VNEG for the SONOS technology can be in the range of −3 to −7.5V in an exemplary embodiment but the circuit 400 can work for other VNEG levels too) to turn off the gate bootstrapped transistor 420. This causes the gate bootstrapped transistor 420 to further isolate the LV Row Driver 410 from the WL that is driven to a negative voltage level by the first transistor 430.

According to an exemplary embodiment of the present invention, the high speed word line driver circuit 400 further comprises a P-channel High Voltage (PHV) MOS device 450 or the like coupled to a common node of the first transistor 430 and the gate bootstrapped transistor 420, although the PHV MOS device 450 can comprise any suitable type of transistor device. A gate terminal of the PHV MOS device 450 is coupled to the signal row bar (rowb). A source terminal of the PHV MOS device 450 is coupled to a voltage signal for programming (prgb). The common node of the PHV MOS device 450, the first transistor 430, and the sate bootstrapped transistor 420 are coupled to a WL that drives the select transistor of the memory cell. The PHV MOS device 450 is used during static/DC reads to keep the selected WL high even if the node rboot leaks away. During memory program operation, the PHV MOS device 450 is turned off by bringing the signal prgb to LV ground. Devices 430, 440 and 450 are minimal (minimal transistor width and channel length allowed by SONOS process technology) sized HV devices. The gate bootstrapped transistor 420 is relatively-sized high (approx. a 10X to 20X increase in transistor width compared to minimum width allowed by process technology in an exemplary and non limiting embodiment) for high speed operation. The bootstrap action of the gate bootstrapped transistor 420 keeps its gate drive high.

In accordance with an exemplary embodiment of the invention, an implementation of the high speed word line driver circuit 400 includes, but is not limited to, the following values: LV ground=0, LV max supply voltage=2V, LV min supply voltage=1.5V, HV min voltage=−7.5V and HV max voltage=6V. However, other suitable values can be used. An HV device has a threshold voltage ranging between about 0.8V and about 1.2V. A native depletion mode HV device comprises a HV device with approximately zero threshold voltage. An LV device comprises a transistor with a gate oxide thickness of about 32 Angstorm in an implementation of the high speed row driver circuit 400. An LV device has a threshold voltage ranging between about 0.4V and about 0.6V. An LV device can withstand the LV voltage mentioned above, and an HV device can withstand both the LV and HV voltages mentioned above.

Figure 5:
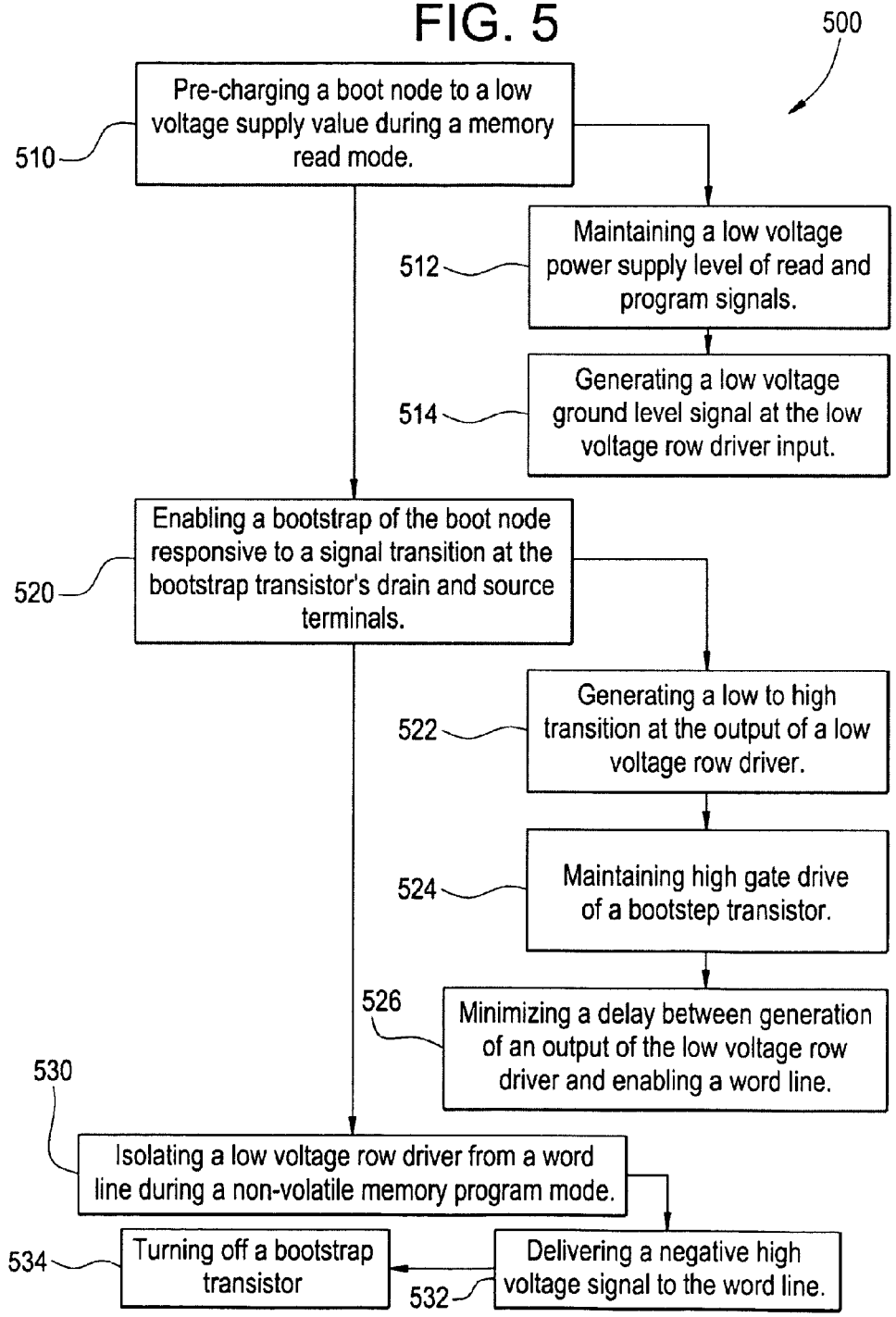
FIG. 5 illustrates a method for providing bootstrapped driving capability with high voltage isolation using low supply voltage tolerant word line (WL) driver, in accordance with an exemplary embodiment of the present invention.

FIG. 5 illustrates a method 500 for providing bootstrapped high voltage isolation using low supply voltage tolerant word line (WL) driver in accordance with an exemplary embodiment of the present invention. A first step 510 comprises pre-charging a boot node to a low voltage supply value during a memory read mode. A second step 520 comprises enabling a bootstrap of the boot node responsive to a signal transition at the drain and source terminals of the bootstrap transistor. A third step 530 comprises isolating a low voltage row driver from a word line during a non-volatile memory program mode.

The step 510 comprises a first sub step 512 of maintaining a low voltage power supply level of read and program signals. The step 510 comprises a second sub step 514 of generating a low voltage ground level signal at the low voltage row driver input. The step 520 comprises a first sub step 522 of generating a low to high transition at the output of a low voltage row driver. The first sub step 522 is followed by a second sub step 524 of maintaining high gate drive of a bootstrap transistor. The second sub step 524 is followed by a third sub step 526 of minimizing a delay between generation of an output of the low voltage row driver and enabling a word line. The step 530 comprises a sub step 532 of delivering a negative high voltage signal to the word line. The step of delivering a negative high voltage signal to the word line comprises a sub step 534 of turning off a bootstrap transistor. In accordance with an exemplary embodiment of the present invention, the method 500 comprises a first step of connecting a HV keeper device in a bootstrap circuit under direct current (DC) or slow speed conditions. The method 500 comprises a second step of connecting grounded gate HV devices to steer negative voltages to the WL during non-volatile memory program mode.

Figure 6:
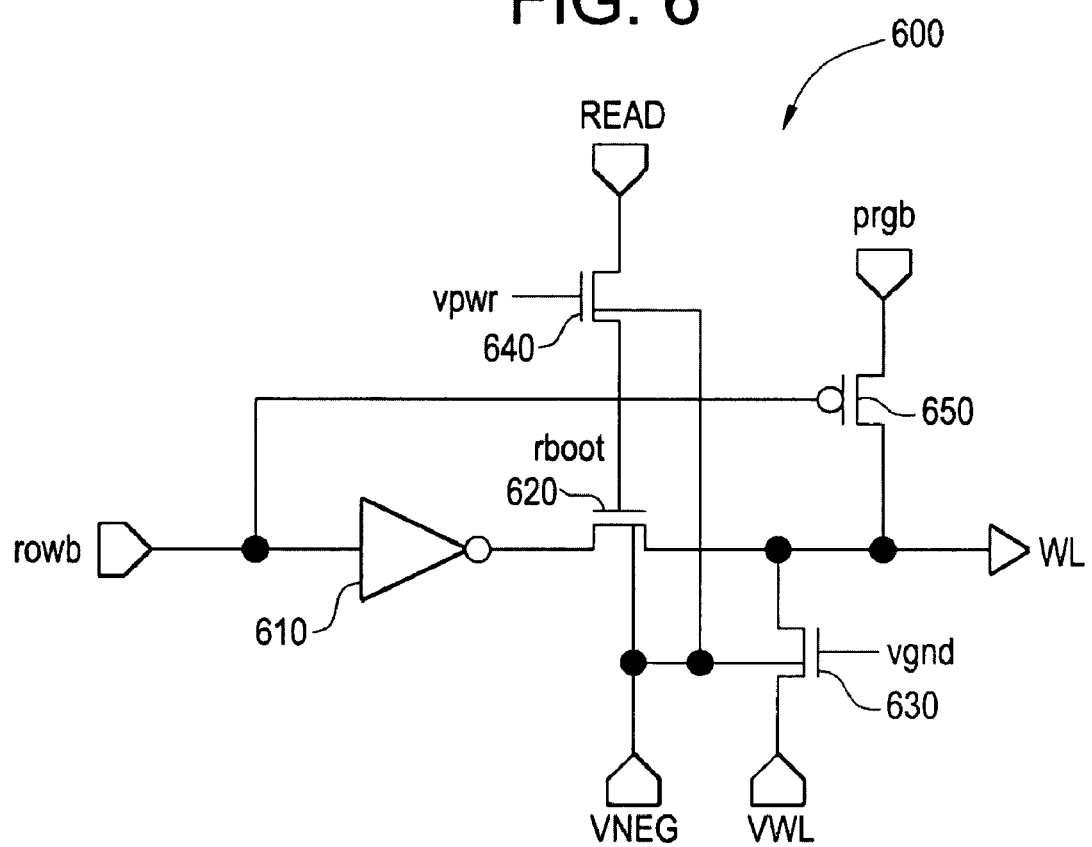
FIG. 6 illustrates a word line driving device, in accordance with an exemplary embodiment of the present invention.

FIG. 6 illustrates a word line driving device 600 in accordance with an exemplary embodiment of the present invention. The device 600 comprises a low voltage row driver circuit 610. A gate bootstrapped transistor 620 is coupled to the low voltage row driver circuit 610. A write mode transistor 630 is coupled to the gate bootstrapped transistor 620. A source follower transistor 640 is coupled to a gate terminal of the gate bootstrapped transistor 620. The source follower transistor 640 is configured as a pre-charging circuit and an isolation circuit. The device 600 also includes a keeper device 650 to assist in keeping WL high When the word line is selected with long cycle time conditions.

According to an exemplary embodiment the low voltage row driver circuit 610 comprises an inverter circuit or other like circuit or device. According to an exemplary embodiment, the gate bootstrapped transistor 620 can comprise a bootstrapped NHV MOS device or the like, although the gate bootstrapped transistor 620 can comprise any suitable type of bootstrapped transistor device. For example, the bootstrapped NHV MOS transistor 620 can comprise a gate terminal bootstrapped above LV power supply levels. According to an exemplary embodiment, the write mode transistor 630 can comprise an NHV MOS device or the like coupled between an output terminal of the gate bootstrapped transistor 620 and a word line high voltage signal, although the write mode transistor 630 can comprise any suitable type of transistor device. The source follower transistor 640 can comprise an NHV MOS Native Depletion device or the like coupled between a gate terminal of the gate bootstrapped transistor 620 and a read signal, although the source follower transistor 640 can comprise any suitable type of transistor device. The word line driving circuit 600 can further comprise a PHV MOS device 650 or the like coupled to a common node of the write mode transistor 630 and the gate bootstrapped transistor 620.

FIG. 7 is a flowchart of a method 700 illustrating a normal read operation of a memory according to an exemplary embodiment of the present invention. During memory read operation, signals vpwr, READ and prgb are at the LV power supply level. Signals VNEG and VWL are at LV ground level (0V). In a first step 710, deselected input signal rowb is high and is at the LV power supply level which causes the output of LV Row Driver 410 to be low. Since the bootstrap node rboot is at the LV high level, signal WL is also low. In a second step 720, native depletion device 440 (threshold voltage $V_T$=0) pre-charges the node rboot to LV high level so that the gate bootstrapped transistor 420 is turned ON even if the LV high level is fairly low (e.g., approximately 1.5V). The first transistor 430 is in a turned-off state since its gate terminal is grounded and VWL is at ground. PHV MOS device 450 is in a turned off state.

In a third step 730, when input rowb goes low, output of LV Row Driver 410 rises, and, since the bootstrap transistor 420 is ON, drain/channel/source to gate coupling also causes rboot to rise to cut off source follower transistor 440, thus allowing rboot to rise (bootstrap) above the LV power supply level. Such a condition keeps the gate drive of the gate bootstrapped transistor 420 high with the delay between output of LV Row Driver 410 and WL as minimal. According to an exemplary embodiment, the maximum level to which rboot can bootstrap is approximately two times the LV high level, but usually is less due to parasitic loading on the rboot and the initial level of rboot during pre-charge operation. Nevertheless, the word line WL will rise to the LV high level. The bootstrapping of the gate bootstrapped transistor 420 overcomes headroom issues related to high threshold voltage $V_T$ of a generic NHV device. In a fourth step 740, rowb goes low to select the WL, PHV MOS device 450 turns on to keep WL high even during static/DC reads. In a fifth step 750, after a read has occurred and rowb goes back high, output of LV Row Driver 410 goes back low along with WL which in turn pulls rboot back to the LV power supply level. PHV MOS 450 turns off without any delay and is ready for the next memory row access.

In an exemplary embodiment or the invention, during non-volatile (NV) memory Write operation, a HV is sent to the WL. The WL goes to a negative HV voltage to achieve better program inhibition characteristics and memory cell reliability. However, it is not necessary that to the present invention be limited to WL that only goes negative during NV program operations. When the WL is biased to HV during program operations, the LV Row Driver 410 circuitry is to be isolated from the WL. Thus, the bootstrap transistor 420 is to be turned on during the memory program operation.

FIG. 8 is a flowchart of a method 800 illustrating a NV program operation of a memory according to an exemplary embodiment of the present invention. In a first step 810, the signal vpwr is at the LV high level. In a second step 820, the signals READ and VNEG are driven to the low HV level, which is a negative value (VNEG is approximately −4V in a SONOS EEPROM or a Flash memory in an exemplary and a non limiting embodiment). The signal voltage word line VWL is driven to a negative level and the signal prgb is at LV ground. In a third step 830, as a result of the signal inputs, rboot will be at the VNEG level. The gate bootstrapped transistor 420 will be in a turned off state, thereby isolating the WL (at HV level) from LV Row Driver 410. The PHV MOS transistor 450 is in a turned off state since prgb is at LV ground. In a fourth step 840, when VWL goes below the voltage vgnd by approximately −1V (assuming the approximate threshold voltage $V_T$ of device 430 is 1V), the first transistor 430 turns on und VWL voltage will be driven onto the WL. Therefore, a VWL voltage of between approximately −1V and the VNEG level can be driven onto the WL.

There are many advantages of the word line driver circuit 400 and other exemplary embodiments of the present invention. For example, high speed operation is enabled by the bootstrapped device. Another advantage of the driver 400 is that there is no need for complex HV control on the HV steering device 430 because of its grounded gate configuration. The PHV MOS device 450 allows static/DC operation of the WL driver during reads. The PHV MOS device 450 assists in maintaining the WL at its LV high level in case the charge on the bootstrapped node rboot leaks off, for example, due to sub-threshold leakages. The gate bootstrapped transistor 420 can be turned off to isolate HV on WL from LV Row Driver 410. The source follower transistor 440 pre-charges gate of gate bootstrapped transistor 420 during reads and also passes isolation voltage onto gate of gate bootstrapped transistor 420 during memory program operations. Thus, the exemplary embodiments of the provide invention provide a fast bootstrapped Word Line driver that is unaffected by power supply headroom issues. The bootstrapping method is leakage insensitive because of the keeper device. Further, the driver circuit of an exemplary embodiment of the present invention provides high voltage isolation to low voltage devices during NV operations. However, the exemplary embodiments of the present invention are not confined to NV operations. The driver circuit is also area efficient. A high speed row driver circuit with bootstrapped interface to WL is thus provided by an exemplary embodiment of the present invention.

Exemplary embodiments of the present invention can be used in conjunction with any suitable type of integrated circuit, such as NV memory or storage devices, to minimize leakage and to overcome speed and/or power supply headroom limitations. Further, the circuit also has the capability to isolate high voltages on the WL from the LV row driver. The exemplary embodiments of the present invention find use in NV memory technologies and other like products. However, the circuit and device of the invention are not restricted to NV memory products and can be used with other suitable technologies, products, and devices.

Embodiments of the present invention are well suited to performing various other steps or variations of the steps recited herein, and in a sequence other than that depicted and/or described herein. In one embodiment, such a process can be embodied in any computer-readable medium for use by or in connection with an instruction execution system, apparatus, or device, such as a computer-based system, processor-containing system, or other system that can fetch the instructions from the instruction execution system, apparatus, or device and execute the instructions. As used herein, a computer-readable medium can be any means that can contain, store, communicate, propagate, or transport the program for use by or in connection with the instruction execution system, apparatus, or device. The computer readable medium can be, for example but not limited to, an electronic, magnetic, optical, electromagnetic, infrared, or semiconductor system, apparatus, device, or propagation medium. More specific examples (a non-exhaustive list) of the computer-readable medium can include the following: an electrical connection having one or more wires, a portable computer diskette, a random access memory (RAM), a read-only memory (ROM), an erasable programmable read-only memory (EPROM or Flash memory), an optical fiber, and a portable compact disc read-only memory (CDROM).

Details of the improved word line driver circuit and the methods of designing and manufacturing the same that are widely known and not relevant to the present discussion have been omitted from the present description for purposes of clarity and brevity.

It should be appreciated that reference throughout the present specification to "one embodiment" or "an embodiment" means that a particular feature, structure or characteristic described in connection with the embodiment is included in at least one embodiment of the present invention. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more exemplary embodiments of the present invention.

Similarly, it should be appreciated that in the foregoing discussion of exemplary embodiments of the invention, various features of the present invention are sometimes grouped together in a single embodiment, figure, or description thereof for the purpose of streamlining the disclosure to aid in the understanding of one or more of the various inventive aspects. Such a method of disclosure, however, is not to be interpreted as reflecting an intention that the claimed invention requires more features than are expressly recited in each claim. Rather, as the following claims reflect, inventive aspects lie in less than all features of a single foregoing disclosed embodiment.

It will be appreciated by those of ordinary skill in the art that the present invention can be embodied in various specific forms without departing from the spirit or essential characteristics thereof. The presently disclosed embodiments are considered in all respects to be illustrative and not restrictive. The scope of the invention is indicated by the appended claims, rather than the foregoing description, and all changes that come within the meaning and range of equivalence thereof are intended to be embraced.

What is claimed is:

1. A circuit, comprising:
   a low voltage driver;
   a gate bootstrapped transistor coupled to the low voltage driver;
   a first transistor coupled to an output terminal of the gate bootstrapped transistor, wherein a substrate of the first transistor is coupled to a negative bias signal; and
   a second transistor coupled to a gate terminal of the gate bootstrapped transistor, wherein a substrate of the second transistor is coupled to the negative bias signal.

2. The circuit of claim 1, wherein the low voltage driver comprises an inverter circuit.

3. The circuit of claim 1, wherein the gate bootstrapped transistor comprises a bootstrapped N-channel High Voltage (NHV) Metal Oxide Semiconductor (MOS) device.

4. The circuit of claim 3, wherein the bootstrapped NHV MOS transistor comprises a gate terminal bootstrapped above a Low Voltage (LV) power supply level.

5. The circuit of claim 1, wherein the first transistor comprises a N-channel High Voltage (NHV) Metal Oxide Semiconductor (MOS) device coupled between the output terminal of the gate bootstrapped transistor and a word line high voltage signal.

6. The circuit of claim 1, wherein the second transistor comprises a N-Channel High Voltage (NHV) Metal Oxide Semiconductor (MOS) native depletion device coupled between a gate terminal of the gate bootstrapped transistor and a read signal.

7. The circuit of claim 1, further comprising a P-channel High Voltage (PHV) Metal Oxide Semiconductor device coupled to a common node of the first transistor and the gate bootstrapped transistor.

8. The circuit of claim 1, wherein a size of the gate bootstrapped transistor is larger than a size of both the first transistor and the second transistor.

9. A word line driving device, comprising:
   a low voltage row driver circuit;
   a gate bootstrapped transistor coupled to the low voltage row driver circuit;
   a write mode transistor coupled to the gate bootstrapped transistor, wherein the write mode transistor is coupled between an output terminal of the gate bootstrapped transistor and a word line high voltage signal, wherein the output terminal is a word line, and wherein the write mode transistor provides the word line high voltage signal to the word line during a memory program operation; and
   a source follower transistor coupled to a gate terminal of the gate bootstrapped transistor, wherein the source follower transistor is configured as a pre-charging circuit.

10. The device of claim 9, wherein the low voltage row driver circuit comprises an inverter circuit.

11. The device of claim 9, wherein the gate bootstrapped transistor comprises bootstrapped N-channel High Voltage (NHV) Metal Oxide Semiconductor (MOS) device.

12. The device of claim 11, wherein the bootstrapped NHV MOS transistor comprises a gate terminal bootstrapped above Low Voltage (LV) power supply levels.

13. The device of claim 9, wherein the write mode transistor comprises an N-channel High Voltage (NHV) Metal Oxide Semiconductor (MOS) device coupled between an output terminal of the gate bootstrapped transistor and a word line high voltage signal.

14. The device of claim 9, wherein the source follower transistor comprises an N channel High Voltage (NHV) Metal Oxide Semiconductor (MOS) native depletion device coupled between a gate terminal of the gate bootstrapped transistor and a read signal.

15. A method, comprising:
   pre-charging a boot node to a low voltage supply value during a memory read mode;
   enabling a bootstrap of the boot node responsive to a signal transition at drain and source nodes of a bootstrap transistor; and
   isolating a low voltage row driver from a word line during a non-volatile memory program mode, wherein the isolating comprises delivering negative high voltage signal to the word line.

16. The method of claim 15, wherein the pre-charging comprises:
   maintaining a low voltage power supply level of read and program signals; and
   generating a low voltage level signal through a low voltage row driver input.

17. The method of claim 15, wherein the enabling comprises:
   generating a low to high transition at an output of a low voltage row driver;
   maintaining high gate drive of the bootstrap transistor; and
   minimizing a delay between generation of the output of the low voltage row driver and enabling a word line.

18. The method of claim 15, wherein the step of isolating comprises delivering negative high voltage signal to the word line.

19. The method of claim 18, wherein the delivering comprises turning off the bootstrap transistor.

20. The method of claim 15, comprising:

connecting a high voltage (HV) keeper device in a bootstrap circuit under direct current (DC) or slow speed conditions; and connecting grounded gate HV devices to steer negative voltages to a word line during memory program operations.

* * * * *